US012203967B2

(12) United States Patent
Weiner (10) Patent No.: US 12,203,967 B2
(45) Date of Patent: Jan. 21, 2025

(54) IMPEDANCE MEASUREMENT (71) Applicant: Nicholas Weiner, Bristol (GB)

(72) Inventor: Nicholas Weiner, Bristol (GB)

(73) Assignee: Nicholas Weiner (GB)

( * ) Notice: Subject to any disclaimer, the term of this patent is extended or adjusted under 35 U.S.C. 154(b) by 141 days.

(21) Appl. No.: 18/167,405

(22) Filed: Feb. 10, 2023

(65) Prior Publication Data
US 2023/0266371 A1    Aug. 24, 2023

(51) Int. Cl.
*G01R 27/02*   (2006.01)
*G01R 19/00*   (2006.01)
*G01R 19/10*   (2006.01)

(52) U.S. Cl.
CPC ........... *G01R 27/02* (2013.01); *G01R 19/003* (2013.01); *G01R 19/10* (2013.01)

(58) Field of Classification Search
CPC ...... G01R 19/003; G01R 19/10; G01R 27/02; G01R 17/105; G01R 27/14; G01R 27/2605; A61B 5/0531
See application file for complete search history.

(56) References Cited

U.S. PATENT DOCUMENTS

| | | | |
|---|---|---|---|
| 5,311,140 A | 5/1994 | Permuy | |
| 6,215,319 B1 | 4/2001 | Hafer et al. | |
| 2018/0143270 A1 | 5/2018 | Van Dongen et al. | |
| 2022/0404407 A1* | 12/2022 | Mistry | G01R 27/2605 |

FOREIGN PATENT DOCUMENTS

JP    2013088383 A    5/2013

OTHER PUBLICATIONS

Combined Search and Examination Report received for Great Britain Application 2301390.7 received Jul. 10, 2023, 6 pages.
Combined Search and Examination Report received for GB application GB2312461.3 received on Jan. 15, 2024, 5 pages.
Search Report received for Great Britain Application 2202243.8 received Jul. 26, 2022, 4 pages.

* cited by examiner

*Primary Examiner* — Jay Patidar (57) ABSTRACT

Circuitry for characterising a test impedance of a test load, the test load coupled between a sense node and a first driver node, the circuitry comprising: driver circuitry configured to apply a time-varying test stimulus between the first driver node and a second driver node, the test stimulus varied in step changes at one or more signal events; a reference load coupled between the second driver node and the sense node, the reference load having a programmable impedance; and a first integrator configured to integrate a voltage derived from the sense node to generate a first integrated signal; and measurement circuitry configured to derive one or more characteristics of the test impedance based on the programmable impedance and the first integrated signal.

26 Claims, 6 Drawing Sheets

IMPEDANCE MEASUREMENT

TECHNICAL FIELD

The present disclosure relates to circuitry for measuring impedance.

BACKGROUND

Impedance sensors, typically comprising two or more electrodes, may be used to characterise the impedance of nearby objects. For some applications, for example biological applications, it may be beneficial to determine a magnitude of capacitive coupling between two electrodes of a sensor on the one hand and between the electrodes and a sensed object (such as skin) on the other hand and also to sense the resistance, between locations close to the electrodes, presented by the object. Thus, a distinction can be made between capacitive coupling between the electrodes and the object and direct capacitive coupling between the electrodes, so that the sense object can be characterised.

A known approach to impedance sensing, involves applying a sinusoidal stimulus (voltage or current) of controlled amplitude across electrodes of a sensor and measure phase and magnitude of the resultant sinusoidal response (current or voltage). Typically, the stimulus is swept through multiple frequencies to obtain information about the impedance across the electrodes. Such techniques typically require the generation of stimuli and subsequent measurement of responses in the MHz range. Considerable power dissipation and circuit complexity is required to implement measurements at these frequencies with sufficient accuracy and precision.

Another approach to impedance sensing is to use an impedance bridge. A test load with impedance to be measured is coupled in series at a sense node with a reference load of known impedance. A stimulus is applied across the series connected test load and reference load and a response is measured at the sense node. The reference impedance may be adjusted such that a null response is detected at the sense node. Alternatively, knowledge of the response at the sense node and of the reference load impedance may be used to compute the test load impedance. It is difficult at low cost and low power to determine characteristics of complex test load impedances using such impedance bridges.

SUMMARY

According to a first aspect of the disclosure, there is provided circuitry for characterising a test impedance of a test load, the test load coupled between a sense node and a first driver node, the circuitry comprising: driver circuitry configured to apply a time-varying test stimulus between the first driver node and a second driver node, the test stimulus varied in step changes at a one or more of signal events; a reference load coupled between the second driver node and the sense node, the reference load having a programmable impedance comprising: a first programmable capacitance; a programmable resistance connected in series with the first programmable capacitance to form a series combination; and a first integrator configured to integrate a sense node voltage derived from the sense node to generate a first integrated signal.

The circuitry may further comprise: measurement circuitry configured to derive one or more characteristics of the test impedance based on the programmable impedance, the sense node voltage and the first integrated signal.

The circuitry may further comprise a second integrator configured to integrate the first integrated signal, wherein the processing circuitry is configured to derive the one or more characteristics of the test impedance based on the second integrated signal.

The reference load may further comprise a second programmable capacitance connected in parallel with the series combination of the first programmable capacitance and the programmable resistance.

Applying the test stimulus between the first driver node and the second driver node may comprise applying a first voltage at the first driver node, the first voltage varying in one or more first step changes at the one or more of signal events; applying a second voltage at the second driver node, the second voltage varying in one or more second step changes at the one or more signal events; wherein each first step change of the one or more first step changes is in an opposite direction to a respective corresponding second step change of the one or more second step changes, wherein the first voltage and the second voltage vary relative to a first reference voltage.

Applying the test stimulus between the first driver node and the second driver node may comprise: substantially simultaneously switching a polarity of each of the first voltage and the second voltage, the first voltage and the second voltage having opposite polarities.

The circuitry may be further configured to pre-charge the sense node prior to each of the one or more signal events. The circuitry may be configured to sample a sense voltage at the sense node to obtain a first measurement.

The circuitry may be configured to adjust the programmable impedance of the reference load based on the first measurement. Adjusting the programmable impedance may comprise adjusting the first programmable capacitance.

The reference load may further comprise a second programmable capacitance connected in parallel with the series combination of the first programmable capacitance and the programmable resistance, wherein the adjusting the programmable impedance comprises adjusting a sum of the first and second programmable capacitances.

The circuitry may be configured to use a binary search algorithm to adjust the programmable impedance that minimize a magnitude of the first measurement.

The circuitry may be configured to use a multi-bit digital representation of first measurement to adjust the programmable impedance that minimize a magnitude of the first measurement.

The circuitry may be configured to initialise the first integrator prior to a second sequence of the one or more signal events; and enable the first integrator for a first duration of time following each signal event of the second sequence to obtain a second measurement of the first integrated signal, the second measurement representing a mean value of the sense voltage integrated over the first duration following each signal event of the second sequence.

The circuitry may be further configured to adjust the programmable impedance of the reference load based on the second measurement.

Adjusting the programmable impedance comprises adjusting the programmable resistance.

The reference load comprises a second programmable capacitance connected in parallel with the series combination of the first programmable capacitance and the programmable resistance, Adjusting the programmable impedance may comprise adjusting one or more of the first programmable capacitance and the programmable resistance whilst substantially maintaining a constant value of a sum of the first and second programmable capacitances.

The circuitry may be configured to use a binary search algorithm to find values of the programmable impedance that minimize a magnitude of the second measurement.

The circuitry may be configured to use a multi-bit digital representation of second measurement to find values of the programmable impedance that minimize a magnitude of the second measurement.

Where the circuitry comprises the second integrator and the reference load comprises the second programmable capacitance, the circuitry may be configured to:

initialise the first integrator prior to each signal event in a third sequence of the one or more signal events; initialise the second integrator prior to the third sequence; and enable the first integrator and the second integrator for a second duration of time following each signal event of the third sequence to obtain a third measurement from the second integrated signal, the third measurement representing a mean double integral over the second duration of the sense voltage following each signal event of the third sequence.

The circuitry may be configured to adjust the programmable impedance of the reference load based on the third measurement. Adjusting the programmable impedance may comprise adjusting the second programmable capacitance whilst maintaining a substantially constant value of a sum of the first and second programmable capacitances and maintaining a substantially constant value of a product of the programmable resistance and square of the first programmable capacitance.

The circuitry may be configured to use a binary search algorithm to find values of the first and second programmable capacitances and the programmable resistance that minimize a magnitude of the third measurement. The circuitry may be configured to use a multi-bit digital representation of third measurement to find values of the first and second programmable capacitances and the programmable resistance that minimize a magnitude of the third measurement.

According to another aspect of the disclosure, there is provide a sensor comprising the circuitry of any one of the preceding claims, wherein: the first driver node comprises a first electrode of the sensor; and the sense node comprises a second electrode of the sensor. The test load may comprise human skin.

According to another aspect of the disclosure, there is provide an integrated circuit comprising circuitry or a sensor as described above.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Embodiments of the present disclosure relate to the novel use of an impedance bridge for the characterisation of the unknown impedance of a test load, hereinafter referred to as a test load impedance ZT.

Figure 1:
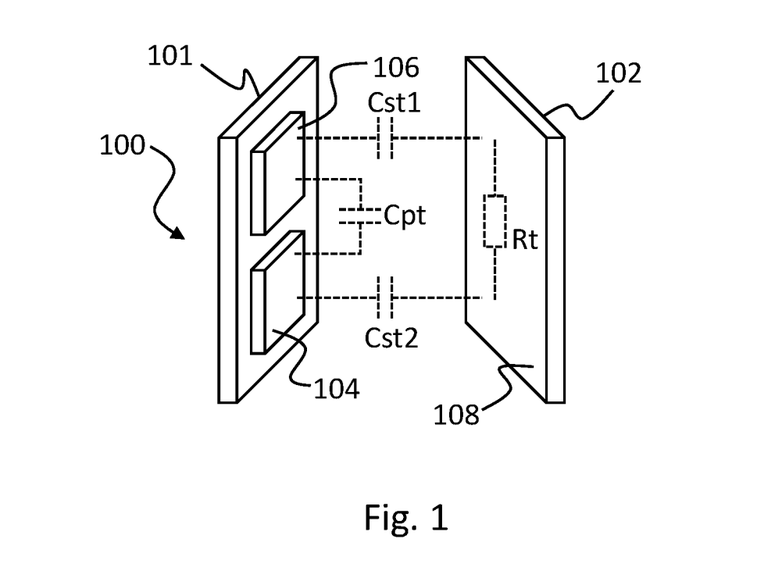
FIG. 1 is a schematic diagram of an impedance sensor.

FIG. 1 is a schematic diagram of an example impedance sensor 100 configured to sense an object 102. In one example, the object 102 is a person's skin. The impedance sensor 100 comprises a printed circuit board (PCB) 101 upon which are located a plurality of electrodes 104, 106. In this example, two electrodes 104, 106 are provided. The sensed object 102 has a surface 108 with a surface resistivity ρ.

When a stimulus is applied across the two electrodes 104, 106, capacitive coupling occurs between the electrodes 104, 106 (i.e. from one electrode 104 to the other electrode 106). The capacitance of this coupling is denoted in FIG. 1 as Cpt. Cpt may incorporate capacitive coupling between the connections to each of the electrodes 104, 106. In addition to this capacitance Cpt between the electrodes, capacitive coupling occurs between electrodes 104, 106 and the surface 108 of the object 102. This capacitive coupling from one electrode 104, to the object 102 and from the object 102 back to the other electrode 106 (or vice versa), are denoted by Cst1 and Cst2 in FIG. 1. The series combination of these capacitances Cst1, Cst2 is denoted by Cst.

The electrodes 104, 106 thus measure the entire test load impedance, herein as the test load impedance ZT, comprising both capacitive components Cst, Cpt as well as the surface resistivity of the object 102. It is desirable to be able to determine the magnitude Cst of the capacitive coupling between the electrodes 104, 106 and the sensed objected 102 so as to distinguish this capacitance Cst from the capacitance Cpt of the coupling directly between the electrodes 104, 106. It is also desirable to be able to detect the resistance Rt of the object 102.

Figure 2:
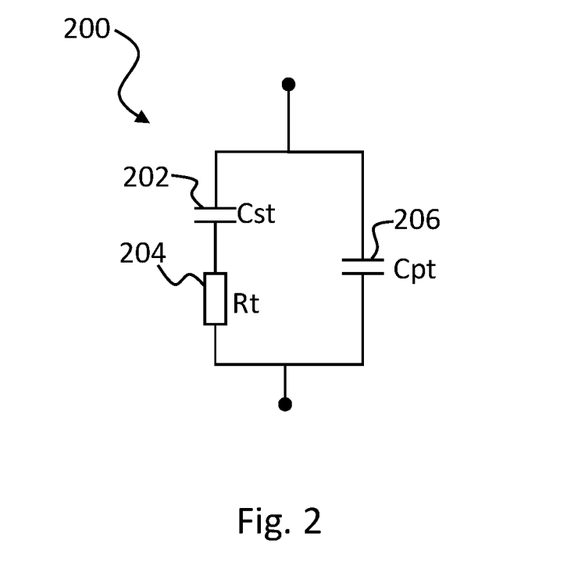
FIG. 2 is a circuit diagram of an impedance model.

FIG. 2 illustrates an example circuit 200 which may be used to model the test load impedance ZL between the two electrodes 104, 106. The circuit 200 comprises a first capacitor 202 having a capacitance Cst in series with a resistor 204 having resistance Rt. The capacitor 202 and resistor 204 thus form a capacitor-resistor series combination. This series combination of the capacitor 202 and the resistor 204 is connected in parallel with a second capacitor 206 having a capacitance Cpt. The second capacitor 206 models, and is therefore representative of any load capacitance directly between the electrodes 104, 106, including any capacitance between the sensor plates that is independent of the object 102, and any capacitance between connections to each of the electrodes 104, 106.

Figure 3:
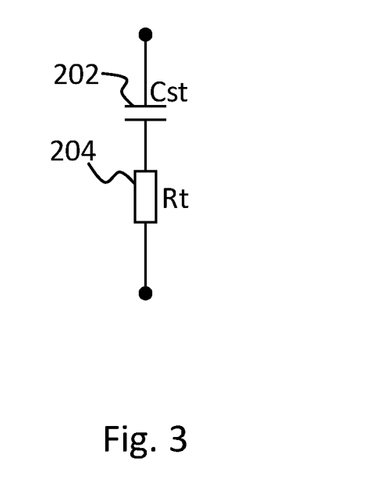
FIG. 3 is a circuit diagram of an impedance model.

FIG. 3 illustrates another example circuit 300 which is a variation of the circuit 200 shown in FIG. 2, like components have like numbering. The circuit 300 is a simplified model for the load impedance between electrodes 104, 106 of the sensor 100 shown in FIG. 1. In this example, the second capacitance 206 has been omitted. It will be appreciated that the circuits 200, 300 shown in FIGS. 2 and 3 are examples of circuits which may be used to model the system shown in FIG. 1.

Embodiments of the present disclosure aim to ascribe values to the components in a circuit model of a test load impedance ZT and thus to characterise the test load impedance ZT. For example, with respect to FIG. 2, embodiments of the present disclosure aim to ascribe values to each of the components 202, 204, 206 of the circuit 200, so as to characterise the test load impedance ZT between the electrodes 104, 106 of the sensor 100.

Figure 4:
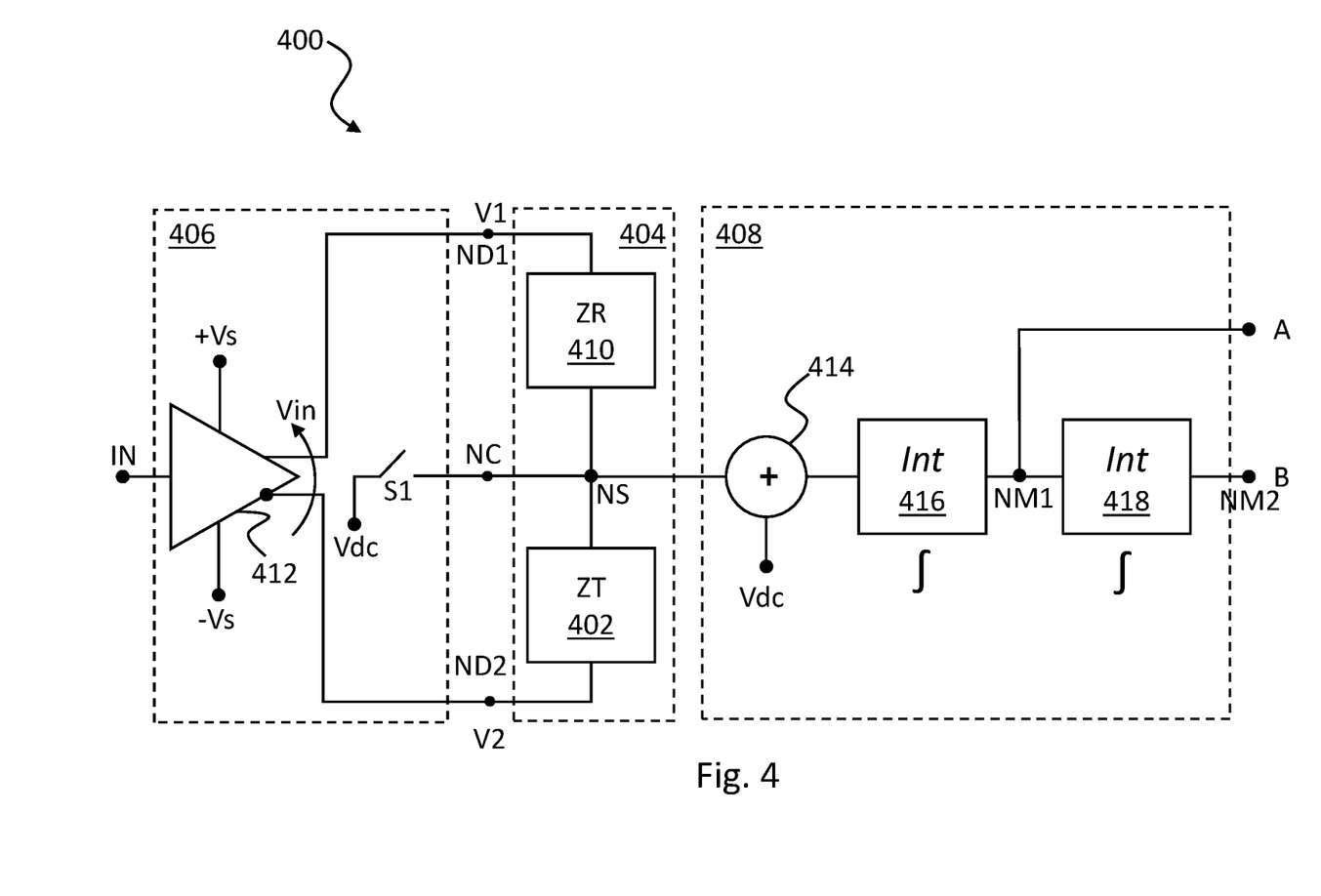
FIG. 4 illustrates circuitry for characterising a test load.

FIG. 4 schematically illustrates circuitry 400 for characterising the impedance ZT of a load under test, referred to herein as a test load 402. The circuitry comprises an impedance bridge 404, drive circuitry 406 and measurement circuitry 408.

The test load 402 is coupled between a second driver node ND2 and a sense node NS. A programmable reference load 410 having an impedance ZR is coupled between the sense node NS and a first driver node ND1. The series combination of the test load 402 and the reference load 410 form the impedance bridge 404.

The drive circuitry 406 is configured to apply a voltage stimulus Vin across the impedance bridge 404 between the first and second drive nodes ND1, ND2. Generally, the drive circuitry 406 is configured apply a step change in the voltage V1 at the first drive node ND1 which is temporally aligned with a step change in the voltage V2 at the second drive node ND2. Both step changes in voltage may be considered with respect to the local ground and reference voltages described below. The changes in the voltages V1, V2 being in opposite directions (i.e. when one voltage V1 becomes more positive, the other voltage V2 becomes more negative, and vice versa). The term step change is used herein to mean a change in voltage from one level to another that occurs over a time period T being less than a time constant associated with the impedance bridge 404. In some embodiments, the time period T may be less than one half (and more preferably less than one quarter) the shortest of all of the time constants associated with the impedance bridge 404 as described with reference to FIG. 4. In a typical implementation, the time period T may be less than 1 nanosecond.

The term "step change event" is used in the following to mean the event of a step change of input voltage Vin, as described above.

Figure 5:
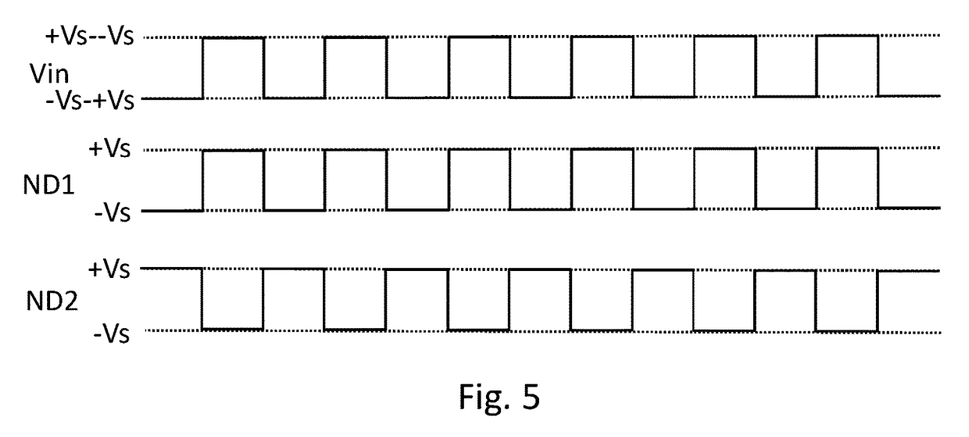
FIG. 5 is a waveform diagram showing example voltages applied to various nodes of the circuitry of FIG. 4.

To achieve this, the drive circuitry 406 comprises a polarity switch 412 configured to switch the input voltage Vin between +Vs minus −Vs and −Vs minus +Vs. As a result, each of the first and second nodes ND1, ND2 are switched between +Vs and −Vs. The resultant voltage at each of the first and second nodes ND1, ND2 is shown in the waveform in FIG. 5. Whilst the first node ND1 is at +Vs, the second node ND2 is at −Vs. Likewise, whilst the first node ND1 is at −Vs, the second node ND2 is at +Vs. Optionally, the drive circuitry 406 may further comprise a switch S1 coupled between a DC reference voltage Vdc and the sense node NS. The switch S1 will be to initialise the drive circuitry, as will be described in more detail below.

The measurement circuitry 408 is coupled to the sense node NS. The measurement circuitry 408 comprises a difference circuit 414, a first integrator 416 and a second integrator 418. In some arrangements, the second integrator 418 may be omitted.

The difference circuit 414 is configured to detect a difference between the voltage Vsense at the sense node NS and the reference voltage Vdc (i.e., to detect the value of Vsense with respect to Vdc). A difference signal representing the value of Vsense with respect to Vdc is then output from the difference circuit 414 to the first integrator 416.

The first integrator 416 may be configured to integrate the difference signal and output a first integrated signal to a first measurement node NM1 which may be output as a first measurement output A. The first integrated signal may also be provided, via the first measurement node NM1 to the second integrator 418.

The second integrator 418 may be configured to integrate the difference signal and output a first integrated signal to a first measurement node NM1 which may be output as a second measurement output B. As will be explained in more detail below, the first and second measurement outputs A, B may be used determine one or more characteristics of the test load 402.

Initialisation circuitry may be provided to initialise one or more of the sense node and the first and second integrators 416, 418. Such initialisation circuitry may be implemented as part of the drive circuitry 406 and/or the measurement circuitry 408 or may be provided as separate circuitry. The initialisation circuitry may be configured to pre-charge the sense node NS to an initial voltage, such as to the reference voltage Vdc. The initialisation circuitry may be configured to initialise the first integrator 416 output to zero volts. The initialisation circuitry may be configured to initialise the second integrator 418 output to zero volts.

In the example shown in FIG. 4, initialisation of the sense node NS may implemented using the switch S1, which may be used to pre-charge the sense node NS to voltage Vdc. The reference voltage Vdc may be a non-zero voltage or may be a ground voltage GND. Initialisation of each of the sense node, the first integrator and the second integrator may occur as required during the various measurements described in detail below.

Initialisation and control of the drive circuitry 406 and/or the measurement circuitry 408, including the first and/or second integrators 416, 418, may be controlled by control circuitry (not shown).

Figure 6:
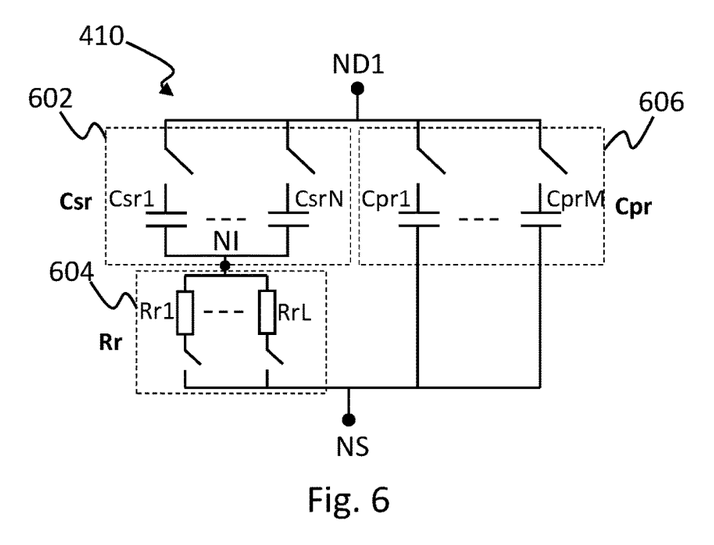
FIG. 6 is an example implementation of a reference load implemented using the circuitry of FIG. 4.

FIG. 6 is a circuit diagram of an example implementation of the programmable reference load 410, which substantially mirrors the test load model circuit 200 shown in FIG. 2.

In this example, the reference load 410 comprising a first capacitance Csr connected in series at an intermediate node NI with a first resistance Rr forming a capacitor-resistor series combination between the first driver node ND1 and the sense node NS. This series combination is connected in parallel with a second capacitance Cpr which is also coupled between the first driver node ND1 and the sense node NS. The first capacitance Csr is provided by a network 602 of N parallel capacitors Csr1:CsrN, each switchably connected between the first driver node ND1 and the intermediate node NI. Thus, the value of the first capacitance Csr can be adjusted by switching in/out each of the capacitors Csr1:CsrN. The resistance Rr is provided by a network 604 of L parallel resistors Rr1:RrL, each switchably connected between the intermediate node NI and the sense node NS. Thus, the value of the resistance Rr can be adjusted by switching in/out each of the resistors Rr1:RrL. The second capacitance Cpr is provided by a network 606 of M parallel capacitors Cpr1:CprM, each switchably connected between the first driver node ND1 and the sense node NS. Thus, the value of the second capacitance Cpr can be adjusted by switching in/out each of the capacitors Cpr1:CprM.

It will thus be appreciated that the impedance ZR of the reference load 410 can be adjusted to substantially match any impedance ZT of the test load 402 limited only by the respective ranges of the first and second capacitances Csr, Cpr and of the resistance Rr and the resolution made available by the switched elements.

In an alternative implementation to that shown in FIG. 2, the programmable reference load 410 may comprise just the first capacitance Csr and resistance Rr.

Figure 7:
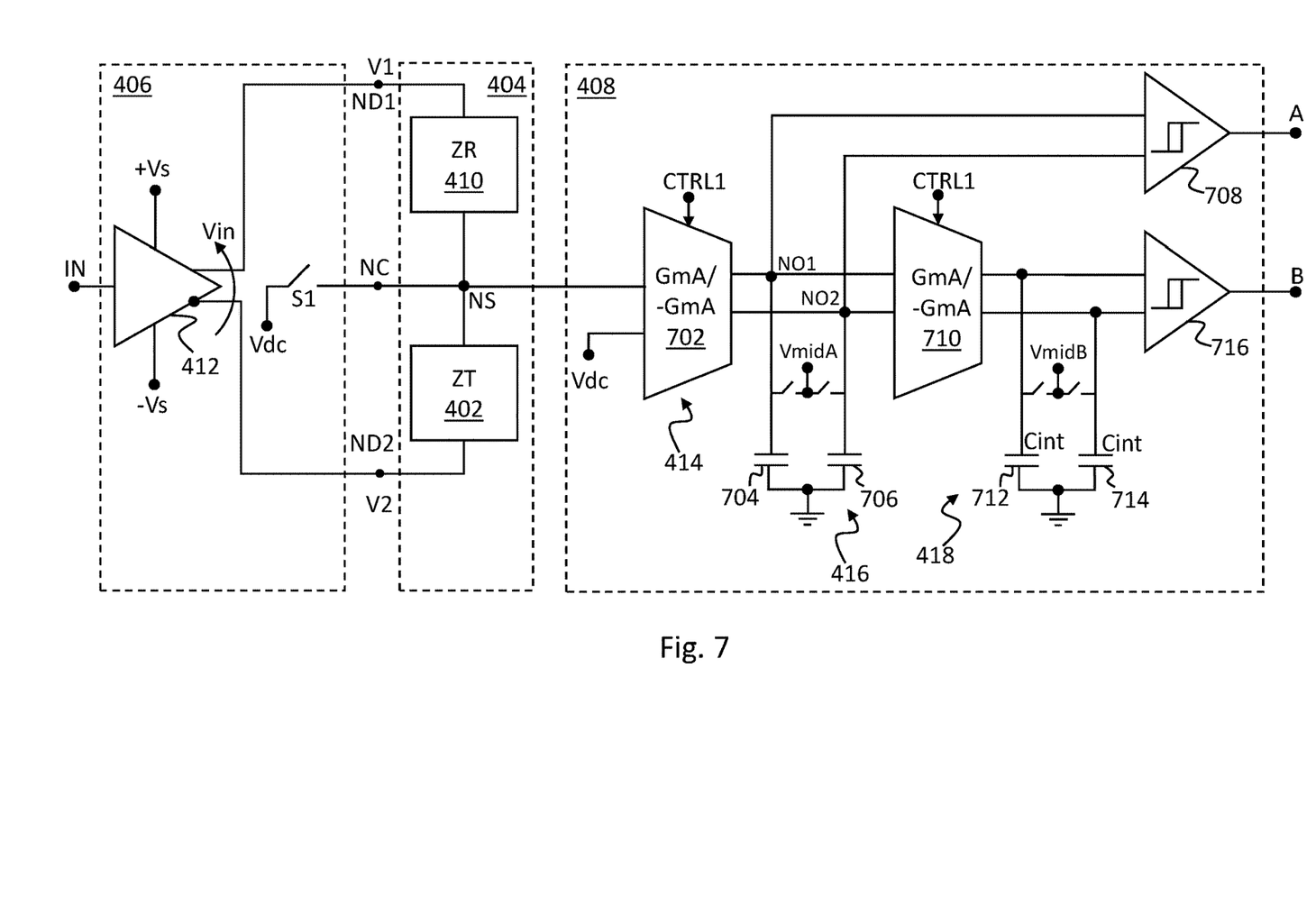
FIG. 7 illustrates circuitry for characterising a test load.

FIG. 7 is a schematic diagram of the circuitry 400 of FIG. 4 showing an example implementation of the measurement circuitry 408. The difference circuit 414 comprises a first transconductance amplifier 702 having a first input coupled to the sense node NS and a second input coupled to the reference voltage Vdc. The first transconductance amplifier 702 further comprises first and second differential outputs and is configured to output a pair of differential output currents to first and second output nodes NO1, NO2 proportional to the voltage difference between the sense voltage Vsense at the sense node NS and the reference voltage Vdc.

The first integrator 416 comprises a pair of capacitors 704, 706 coupled between respective first and second output nodes NO1, NO2 and a constant voltage (for example ground or zero volts). The first and second output nodes NO1, NO2 are each switchably coupled to a reference voltage VmidA via respective switches. The first integrator 416 may be initialized/zeroed/reset (by control circuitry not shown) by closing said switches to thereby applying the same reference voltage VmidA to respective plates of the pair of capacitors 704, 706 coupled to the first and second output nodes NO1, NO2.

It will be thus appreciated that the voltage at the respective first and second output nodes NO1, NO2 represents the integral of the differential current output from the first transconductance amplifier 702.

Optionally, the first and second output nodes NO1, NO2 may be provided to respective inputs of a first comparator 708. The first comparator 708 may act as a 1-bit analog-to-digital converter configured to convert the integrated differential output voltages at the first and second output nodes NO1, NO2 into a binary output, which may be output as the first measurement signal A. As will be discussed in more detail below, such a binary output may be useful for binary search algorithms used to process the first measurement signal A.

The second integrator 418 is implemented by the combination of a second transconductance amplifier 710 and a pair of capacitors 712, 714.

The second transconductance amplifier 710 has a first input coupled to the first output node NO1 and a second input coupled to second output node NO2. The second transconductance amplifier 710 is configured to output a pair of differential output currents to third and fourth output nodes NO3, NO4 proportional to the voltage difference between the voltages at the first and second output nodes NO1, NO2 (which represents the integrated value of the difference between the sense voltage Vsense and the reference voltage Vdc).

The pair of capacitors 712, 714 of the second integrator 418 are coupled between respective third and fourth output nodes NO3, NO4 and a constant voltage (for example ground or zero volts). The third and fourth output nodes NO3, NO4 are each switchably coupled to a reference voltage VmidB via respective switches. The second integrator 418 may be initialized (by control circuitry not shown) by closing said switches to thereby applying the same reference voltage VmidB to respective plates of the pair of capacitors 712, 714 coupled to the first and second output nodes NO3, NO4.

It will be thus appreciated that the voltages at the respective third and fourth output nodes NO3, NO4 represent the integral of the differential current output from the second transconductance amplifier 710.

The third and fourth output nodes NO3, NO4 may be provided as respective inputs to a second comparator 716. Like the first comparator 708, the second comparator 716 may act as a 1-bit analog-to-digital converter configured to convert the integrated differential output voltages at the third and fourth output nodes NO3, NO4 into a binary output, which may be output as the second measurement signal B. As will be discussed in more detail below, such a binary output may be useful for binary search algorithms used to process the second measurement signal B.

In some embodiments, one or both of the first and second transconductance amplifiers 702, 710, may be configurable to reverse the polarity of their differential outputs, with respect to their difference inputs, in response to respective control signals CTRL1, CTRL2. Providing such functionality allows for the difference between the sense voltage Vsense and the reference voltage Vdc to be sampled and integrated following input voltage Vin step change events in both directions (positive to negative and vice versa). The respective control signals CTRL1, CTRL2 may also be configured to turn the respective first and second transconductance amplifiers 702, 710 on and off (i.e. to enable and disable, or pause, the respective integration).

In the above example, two comparators 708, 716 are provided for analog-to-digital conversion. In a variation of this arrangement, these two comparators 708, 716 may be replaced with a single comparator having multiplexed inputs coupled to the first, second, third and fourth output nodes NO1:NO4.

In a variation of the implementation of the measurement circuitry 408 shown in FIG. 7, the differential transconductance amplifiers 702, 710 may be replaced with single-ended analog transconductance amplifiers.

In the example shown in FIG. 7, the sense voltage Vsense at the sense node NS is integrated and then converted into the digital domain. In other embodiments, however, the sense voltage Vsense may be converted into the digital domain and integration performed in the digital domain using digital circuitry or software. In a further variation of FIG. 7, the output of the first transconductance amplifier 702 may be converted into a digital signal and the second integration may be performed in the digital domain using digital circuitry of software.

In the example shown in FIG. 7, the outputs of the first and second integrators are coupled to comparators to derive 1-bit values of first measurement signal A and second measurement signal B. Alternatively, the outputs of the first and/or second integrators may be coupled to one of more multi-bit analog to digital converters to derive multi-bit values of first measurement signal A and second measurement signal B.

Operation of the circuitry 400 of FIG. 4 will now be described.

As noted above, various measurements can be made using measurement circuitry 408 which may be used to determine the following conditions. Such conditions are described (for exemplary context only) with reference to the circuit model 200 shown in FIG. 2 and the example equivalent reference load 410 illustrated in FIG. 6.

Total Capacitance Balance: The condition that the overall capacitance of the test load 402 (e.g., the sum of Cpt and Cst in the test load impedance model 200) is equal to the sum of the reference capacitances Cpr and Csr.

Series Balance: The condition that the product $R_t C_{st}^2$ (of test load impedance model component values) is equal to the product $R_r C_{sr}^2$ (of reference load component values).

Parallel Capacitance Balance: The condition that the terminal-to-terminal capacitance of the test load 402 (i.e., Cpt in the test load impedance model 200) is equal to the reference parallel capacitance Cpr.

In addition to the above, various measurements can be made using the measurement circuitry 408 which may be used to determine the following conditions. Such conditions are described with reference to the test load circuit model 200 shown in FIG. 2 and the example reference load 410 illustrated in FIG. 6.

Total Capacitance Balance Error: The difference between the overall capacitance of the test load 402 (i.e., the sum of Cpt and Cst in the test load impedance model 200) and the sum of the reference capacitances Cpr and Csr.

Series Balance Error: The difference between the product $R_t C_{st}^2$ (of test load model 200 component values) and the product $R_r C_{sr}^2$ (of reference load component values).

Parallel Capacitance Balance Error: The difference between the terminal-to-terminal capacitance of the test load 402 (i.e., Cpt in the test load impedance model 200) and the reference load parallel capacitance Cpr.

The circuitry 400 described herein may be used to ascertain measurements as described below. Such measurements may be used to ascertain the above errors and/or ascertain values for the reference impedance which achieve the above circuit conditions. The following example measurements are provided as non-limiting examples. Other measurements may be obtained without departing from the scope of the present disclosure.

Measurement 1—Settled Value of Vsense with Respect to Vdc

A first measurement M1 may be taken of the mean of the settled values of voltage Vsense with respect to reference voltage Vdc, following each of a sequence of one, or more, input voltage Vin step change events, with Vsense pre-charged to Vdc prior to each step change event.

This first measurement M1 may be ascertained for a sequence of one or more step change events at the first and second driver nodes ND1, ND2. This mean value represents the total capacitance balance error, e.g., the difference between the overall capacitance of the test load 402 (i.e. the sum of Cpt and Cst in the test load impedance model 200) and the sum of the reference capacitances Cpr and Csr. If the first measurement M1 is zero/null, i.e., the difference between the sense voltage Vsense and the reference voltage Vdc is zero, the total capacitance balance condition is met.

It will be appreciated that the sense voltage Vsense at the sense node NS will take some time to settle after each Vin step change event. As such, a time delay may be applied between each step change event and the sampling of the voltage at the sense node NS to allow time for the sense voltage Vsense to settle to a satisfactory level. Alternatively, the sense voltage may be monitored by circuitry (not shown) and sampled once the sense voltage Vsense has settled to a satisfactory level. It will be appreciated that the settling time required, and hence the delay between a step change event and sampling of the sense voltage Vsense, depends upon the required accuracy of the impedance measurement of the test load 402, as well as the values of resistance and capacitance in the test and reference loads 402, 410.

A mean value of Vsense-Vdc following multiple step change events may be ascertained using the first integrator 416. To obtain the mean value, the first integrator 416 may first be initialized/zeroed (e.g., as described above) prior to the start of the sequence of input voltage step change events.

After the first integrator 416 has been initialised, the sequence of one or more step change events is applied to the first and second driver nodes ND1, ND2. Prior to each step change event, the sense node NS is pre-charged to the reference voltage Vdc.

Once the voltage at Vsense has settled (e.g., to a degree necessary to achieve the measurement accuracy required for a particular application), after each step change event in the sequence, the first integrator 416 may be enabled for a duration of time to sample the sense voltage at the sense node NS. The first integrator 416 is then disabled before the next step change event.

As an alternative to using the first integrator 416 to obtain the first measurement M1, the sense voltage Vsense may be sampled directly (for example using a known data converter). An average of several samples could be calculated to obtain a mean of the sense voltage Vsense once settled after each of a sequence of one or more step change events.

As noted above, the first measurement M1 is representative of the total capacitance balance error. By adjusting values of the reference impedance 410, the total capacitance balance error can be resolved to zero (or close to zero), to achieve or approach the total capacitance balance condition referred to above. In some embodiments, the signs of the first measurement M1 can be used in combination with a binary search algorithm to iteratively adjust the values of the first and second programmable capacitances Cpr, Csr so that their sum matches the total load capacitance. That is, to approach total capacitance balance.

Alternatively, an algorithm using the results of multi-bit digital to analog conversion of first measurement result M1 may be used to adjust the values of Cpr and Csr to approach or obtain total capacitance balance.

Measurement 2—Integral, Over Settling Time, of Vsense with Respect to Vdc

A second measurement M2 may be taken which represents the mean value of the integral, over the settling time of voltage Vsense, of voltage Vsense with respect to reference voltage Vdc for each of a sequence of one, or more, input voltage step change events. Where Vsense is pre-charged to Vdc prior to each step change event and the duration of integration, for each step change event, is from the step change event until Vsense has settled to a satisfactory level.

If the Total Capacitance Balance condition is satisfied, then the value of measurement M2 represents the Series Balance Error.

To obtain this second measurement M2, the first integrator 416 is initialized (e.g., as described above) prior to the start of the sequence of input voltage step change events.

Prior to the start of each step change event in the sequence, the sense node NS is pre-charged to the reference voltage Vdc.

The first integrator 416 may then be enabled from the time of each step change event in the sequence until a time at which Vsense has settled to a satisfactory level. As noted above, the settling time required will depend on the required accuracy of impedance measurement of the test load 402. The first integrator 416 may be disabled until the next step change event in the sequence when it is enabled again. It is noted that the first integrator 416 is not initialised between step change events, thus outputting the mean of integrals of the sense voltage Vsense (with respect to Vdc) over multiple step change events in the sequence.

The second measurement M2 will be zero provided two conditions are met, namely the total capacitance balance condition is met, and the value of $R_t C_{st}^2$ is equal to $R_r C_{sr}^2$. As such, provided the total capacitance balance condition is met (e.g., by minimising the value of the first measurement M1), then the second measurement M2 represents the series balance error i.e. the difference between the product $R_t C_{st}^2$ (of test load model component values) and the product $R_r C_{sr}^2$ (of reference load component values).

By adjusting values of the reference impedance 410, the series balance error can be resolved to zero (or close to zero), to approach or obtain the series balance condition referred to above. Making use of the signs of the second measurement M2, a binary search algorithm may be used to iteratively adjust the values of one or more of the first programmable capacitance Csr and the programmable resistance Rr, whilst at the same time adjusting the value of Cpr, as needed, to retain total capacitor balance, to approach or obtain series balance.

Alternatively, an algorithm using the results of multi-bit digital to analog conversion of second measurement result M2 may be used to determine values of Csr and/or Rr for series balance whilst adjusting the value of Cpr, as needed to retain total capacitance balance, to approach or obtain Series Balance.

Measurement 3—Second Integral, Over Settling Time, of Difference Between Vsense and Vdc A third measurement M3 may be taken which represents the mean value of the second integral, over the settling time of voltage Vsense, of the voltage Vsense with respect to reference voltage Vdc for a sequence of one, or more, input voltage step change events. Where Vsense is pre-charged to Vdc, and the output of the first integrator is initialised (e.g. as described above) prior to each step change event and the duration of integration, for each step change event, is from the step change event until Vsense has settled to a satisfactory level.

To obtain the third measurement, the second integrator 418 is first initialized/zeroed (e.g., as described above) prior to the start of the sequence of input voltage step change events. The sense node NS is pre-charged to the reference voltage Vdc and the first integrator 416 is initialized/zeroed (e.g., as described above) prior to each step change event in the sequence.

The first integrator 416 and second integrator 418 may then be enabled from the time of each step change event in the sequence until a time at which Vsense has settled to a satisfactory level.

As noted above, the settling time required will depend on the required accuracy of impedance measurement of the test load 402.

Following each step change event, after the sense Voltage Vsense has settled to a satisfactory level, the first integrator 416 and second integrator 418 may be disabled until the next step change event in the sequence when they are enabled again. It is noted that the second integrator 418 is not initialised between step change events, thus the output at the second measurement node NM2 from the second integrator 418 is the mean of the second/double integral of the sense voltage Vsense with respect to reference voltage Vdc, over the settling time of the sense voltage Vsense, for the sequence of step change events.

If both the total capacitance balance condition and the series balance condition (referred to above) are satisfied, then the value of the third measurement M3 represents the parallel capacitance balance error (i.e. difference between the terminal-to-terminal capacitance of the test load 402 (i.e. Cpt in the test load impedance model) and the reference load parallel capacitance Cpr).

For selected reference impedance values that satisfy both the total capacitance balance and series balance conditions (which may be achieved through use of the first and second measurements M1, M2 described above), the resultant third measurement M3 represents the parallel capacitance balance error. By adjusting values of the reference impedance 410, the parallel capacitance balance error can be resolved to zero (or close to zero), to achieve the parallel capacitance balance condition referred to above.

Making use of sign of the third measurement M3, a binary search algorithm may be used to iteratively adjust the values of the second programmable capacitance Cpr, whilst at the same time adjusting the values of the first programmable capacitance Csr and the programmable resistance Rr, as needed, to retain both total capacitance balance and series balance, to approach or obtain parallel capacitance balance.

Alternatively, an algorithm using the results of multi-bit digital to analog conversion of third measurement result M3 may be used to determine the value of Cpr for parallel capacitance balance whilst adjusting the values of Rr and Csr, as needed, to retain both total capacitance balance and series balance, to approach or obtain parallel capacitance balance.

Thus, the three measurements M1, M2, M3 described above may be used to resolve the value of each component in the test load model circuit 200.

The values of the reference load components, i.e, the first capacitance Csr, the resistance Rr and the second capacitance Cpr, may be re-programmed/updated between each sequence of one or more step change events to minimize one or more of the three measurements M1, M2, M3. Once all three measurements M1, M2, M3 have been resolved to, or approximately to, zero (by adjustment of the first capacitance Csr, the resistance Rr and the second capacitance Cpr) the values Csr, Rr and Cpr represent an approximation of the impedance of the test load 402.

It will be appreciated that the first, second and third measurements M1, M2, M3 make use of sequences of one, or more, input voltage step change events. The values of the three components of the reference load impedance may be re-programmed between step change events. The resulting values of the measurements then correspond to the mean value of each of the three components of the reference load 410.

It is noted, with reference to FIG. 6, that if two adjacent values of a component of the reference load 410 are used, the measurement result for a sequence of step change events will correspond to a component value in a position between the two adjacent values. The position depending upon the proportion of step change events for which the higher and lower values are programmed. For example, with reference to the example reference load 410 shown in FIG. 6, the values of each of three components Csr, Rr, Cpr of the reference load 410 may be programmable with 8-bit precision (8 binary switchable binary-weighted capacitors/resistors in each component). If a measurement is made using a sequence of 256 input voltage step change events, then a result may be obtained correspond to reference impedance component values defined with a further 8 bits of precision, giving 16 bits of precision overall.

In the example shown in FIG. 4, the driver circuitry 406 comprises a single polarity switch 412 operable to drive each of the first and second driver nodes ND1, ND2 to either +Vs or −Vs. In other words, the step changes in voltage at each of the first and second driver nodes ND1, ND2 are of equal amplitude. It will be appreciated, however, that embodiments of the present disclosure are not limited to step changes of equal amplitude.

Figure 8:
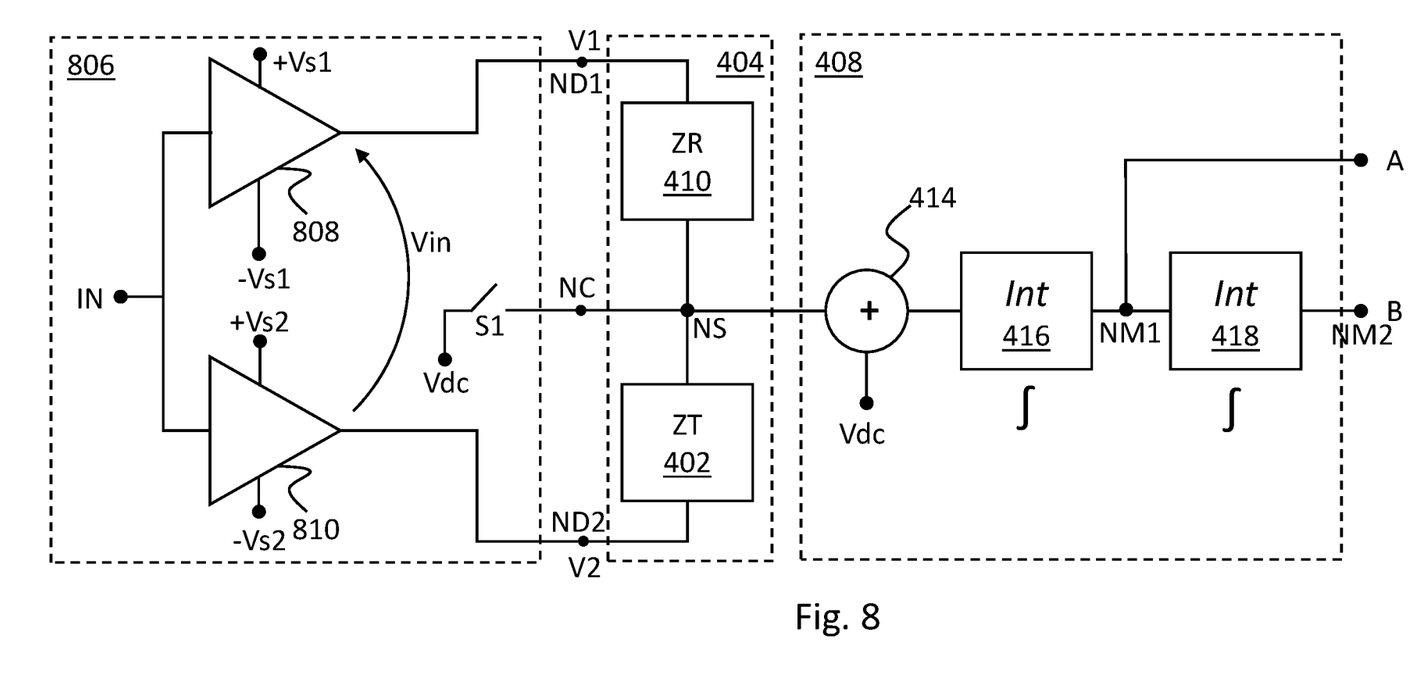
FIG. 8 illustrates circuitry for characterising a test load.

FIG. 8 is a schematic illustration of circuitry 800 which is a variation of the circuitry 400 shown in FIG. 4, like parts given like numbering. The circuitry 800 differs from the circuitry 400 of FIG. 4 in that the driver circuitry 406 has been replaced with driver circuitry 806 which is capable of driving the first and second driver nodes ND1, ND2 with voltages switching/changing in unequal step sizes.

The circuitry 800 comprises a first driver 808 and second driver 810. The first driver 808 is configured to drive the first driver node ND1 with a first voltage V1 which may switch between Vs1H and Vs1L, where Vs1H is more positive than Vs1L. The second driver 810 is configured to drive the second driver node ND2 with a second voltage V2 which may switch between Vs2H and Vs2L, where Vs2H is more positive than Vs2L. Like the driver circuitry 406, the driver circuitry 806 operates to implement step changes in the voltage at the first and second node ND1 substantially in unison. However, it will be appreciated that the difference between Vs1H and Vs1L may be different to the difference between Vs2H and Vs2L. In other words, for this case:

$$Vs1H-Vs1L \neq Vs2H-Vs2L$$

Figure 9:
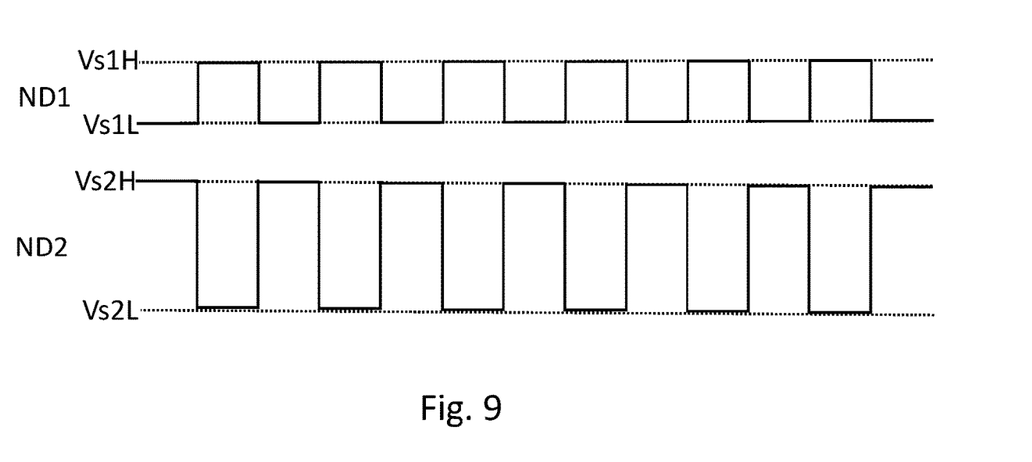
FIG. 9 is a waveform diagram showing example voltages applied to various nodes of the circuitry of FIG. 8.

As such, the step change in voltage at the first node ND1 will be different to the step change in voltage at the second node ND2. FIG. 9 is a waveform illustrating respective voltages V1, V2 at the first and second nodes ND1, ND2 when the difference between Vs2H and Vs2L is greater than the difference between Vs1H and −Vs1L.

In such cases, it will be appreciated that the resolved values of components Csr, Cpr, Rr of the reference load 410 will not directly represent the impedance of the test load 402, but will be scaled by some scaling factor. As such, if such an asymmetric voltage driving regime is implemented, a scaling factors will need to be applied to the resolved component values of the reference load 410 to obtain accurate values of impedance for the test load 402.

Any of the circuitry described above may be implemented on one or more integrated circuits (ICs). For example, an integrated circuit (or integrated circuits) may comprise one or more of the following: the programmable reference load, connection points for a test load, the driver circuitry, an analog, digital or mixed signal implementation of the measurement circuitry, one, or more, analog to digital converters, coupled to the outputs of analog implementations of integrator 1 and/or integrator 2. An analog to digital converter may comprise a comparator giving one-bit quantization, which may be sufficient for impedance sensing using binary search algorithms. Digital circuits making use of the results of the first, second and/or third measurements M1, M2, M3, to control the programmable reference load for impedance sensing, may be included on the same or different integrated circuits.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Circuitry for characterising a test impedance of a test load, the test load coupled between a sense node and a first driver node, the circuitry comprising:
    driver circuitry configured to apply a time-varying test stimulus between the first driver node and a second driver node, the test stimulus varied in step changes at a one or more of signal events;
    a reference load coupled between the second driver node and the sense node, the reference load having a programmable impedance comprising:
    a first programmable capacitance; and
    a programmable resistance connected in series with the first programmable capacitance to form a series combination;
    a first integrator configured to integrate a sense node voltage derived from the sense node to generate a first integrated signal; and
    a difference circuit coupled between the sense node and the first integrator, the difference circuit configured to derive the sense node voltage by determining a difference between a voltage at the sense node and a reference voltage,
    wherein the circuitry is configured to pre-charge the sense node to the reference voltage prior to each of the one or more signal events.

2. Circuitry of claim 1, further comprising:
    measurement circuitry configured to derive one or more characteristics of the test impedance based on the programmable impedance, the sense node voltage and the first integrated signal.

3. Circuitry of claim 1, further comprising:
    a second integrator configured to integrate the first integrated signal, wherein circuitry is configured to derive the one or more characteristics of the test impedance based on the second integrated signal.

4. Circuitry of claim 1, wherein the reference load further comprises:
    a second programmable capacitance connected in parallel with the series combination of the first programmable capacitance and the programmable resistance.

5. Circuitry of claim 1, wherein applying the test stimulus between the first driver node and the second driver node comprises:
    applying a first voltage at the first driver node, the first voltage varying in one or more first step changes at the one or more of signal events;
    applying a second voltage at the second driver node, the second voltage varying in one or more second step changes at the one or more signal events;
    wherein each first step change of the one or more first step changes is in an opposite direction to a respective corresponding second step change of the one or more second step changes,
    wherein the first voltage and the second voltage vary relative to a first reference voltage.

6. Circuitry of claim 5, applying the test stimulus between the first driver node and the second driver node comprises:
    substantially simultaneously switching a polarity of each of the first voltage and the second voltage, the first voltage and the second voltage having opposite polarities.

7. Circuitry of claim 1, wherein the circuitry is configured to:
    sample a sense voltage at the sense node to obtain a first measurement.

8. Circuitry of claim 7, wherein the circuitry is configured to:
    adjust the programmable impedance of the reference load based on the first measurement.

9. Circuitry of claim 8, wherein the adjusting the programmable impedance comprises adjusting the first programmable capacitance.

10. Circuitry of claim 8, wherein the reference load further comprises:
    a second programmable capacitance connected in parallel with the series combination of the first programmable capacitance and the programmable resistance, wherein the adjusting the programmable impedance comprises adjusting a sum of the first and second programmable capacitances.

11. Circuitry of claim 8, wherein the circuitry is configured to:
    use a binary search algorithm a multi-bit digital representation of the first measurement to adjust the programmable impedance that minimize a magnitude of the first measurement.

12. Circuitry of claim 1, wherein the circuitry is configured to:
    initialise the first integrator prior to a second sequence of the one or more signal events; and
    enable the first integrator for a first duration of time following each signal event of the second sequence to obtain a second measurement of the first integrated signal, the second measurement representing a mean value of the sense voltage integrated over the first duration following each signal event of the second sequence.

13. Circuitry of claim 12, wherein the circuitry is further configured to:
adjust the programmable impedance of the reference load based on the second measurement.

14. Circuitry of claim 13, wherein adjusting the programmable impedance comprises adjusting the programmable resistance.

15. Circuitry of claim 13, wherein the reference load comprises:
a second programmable capacitance connected in parallel with the series combination of the first programmable capacitance and the programmable resistance; and
wherein adjusting the programmable impedance comprises adjusting one or more of the first programmable capacitance and the programmable resistance whilst substantially maintaining a constant value of a sum of the first and second programmable capacitances.

16. Circuitry of claim 13, wherein the circuitry is configured to:
use a binary search algorithm or a multi-bit digital representation of second measurement to find values of the programmable impedance that minimize a magnitude of the second measurement.

17. Circuitry of claim 15, further comprising:
a second integrator configured to integrate the first integrated signal, wherein the circuitry is configured to derive the one or more characteristics of the test impedance based on the second integrated signal;
wherein the reference load further comprises:
a second programmable capacitance connected in parallel with the series combination of the first programmable capacitance and the programmable resistance, wherein the circuitry is configured to:
initialise the first integrator prior to each signal event in a third sequence of the one or more signal events;
initialise the second integrator prior to the third sequence;
enable the first integrator and the second integrator for a second duration of time following each signal event of the third sequence to obtain a third measurement from the second integrated signal, the third measurement representing a mean double integral over the second duration of the sense voltage following each signal event of the third sequence.

18. Circuitry of claim 17, wherein the circuitry is configured to:
adjust the programmable impedance of the reference load based on the third measurement.

19. Circuitry of claim 18, wherein adjusting the programmable impedance comprises adjusting the second programmable capacitance whilst maintaining a substantially constant value of a sum of the first and second programmable capacitances and maintaining a substantially constant value of a product of the programmable resistance and square of the first programmable capacitance.

20. Circuitry of claim 18, wherein the circuitry is configured to:
use a binary search algorithm of a multi-bit digital representation of the third measurement to find values of the first and second programmable capacitances and the programmable resistance that minimize a magnitude of the third measurement.

21. A sensor comprising the circuitry of claim 1, wherein:
the first driver node comprises a first electrode of the sensor; and
the sense node comprises a second electrode of the sensor.

22. The sensor of claim 21, wherein the test load comprises human skin.

23. An integrated circuit comprising:
circuitry for characterising a test impedance of a test load, the test load coupled between a sense node and a first driver node, the circuitry comprising:
driver circuitry configured to apply a time-varying test stimulus between the first driver node and a second driver node, the test stimulus varied in step changes at a one or more of signal events;
a reference load coupled between the second driver node and the sense node, the reference load having a programmable impedance comprising:
a first programmable capacitance;
a programmable resistance connected in series with the first programmable capacitance to form a series combination;
a first integrator configured to integrate a sense node voltage derived from the sense node to generate a first integrated signal; and
a difference circuit coupled between the sense node and the first integrator, the difference circuit configured to derive the sense node voltage by determining a difference between a voltage at the sense node and a reference voltage,
wherein the circuitry is configured to pre-charge the sense node to the reference voltage prior to each of the one or more signal events.

24. Circuitry for characterising a test impedance of a test load, the test load coupled between a sense node and a first driver node, the circuitry comprising:
driver circuitry configured to apply a time-varying test stimulus between the first driver node and a second driver node, the test stimulus varied in step changes at a one or more of signal events;
a reference load coupled between the second driver node and the sense node, the reference load having a programmable impedance comprising:
a first programmable capacitance; and
a programmable resistance connected in series with the first programmable capacitance to form a series combination;
a first integrator configured to integrate a sense node voltage derived from the sense node to generate a first integrated signal; and
a second integrator configured to integrate the first integrated signal, wherein the circuitry is configured to derive the one or more characteristics of the test impedance based on the second integrated signal.

25. Circuitry for characterising a test impedance of a test load, the test load coupled between a sense node and a first driver node, the circuitry comprising:
driver circuitry configured to apply a time-varying test stimulus between the first driver node and a second driver node, the test stimulus varied in step changes at a one or more of signal events;
a reference load coupled between the second driver node and the sense node, the reference load having a programmable impedance comprising:
a first programmable capacitance; and
a programmable resistance connected in series with the first programmable capacitance to form a series combination; and
a second programmable capacitance connected in parallel with the series combination; and
a first integrator configured to integrate a sense node voltage derived from the sense node to generate a first integrated signal, wherein the circuitry is further configured to:
  pre-charge the sense node prior to each of the one or more signal events;
  sample the sense voltage to obtain a measurement of the sense voltage; and
  adjust a sum of the first programmable capacitance and the second programmable capacitances based on the measurement.

26. Circuitry for characterising a test impedance of a test load, the test load coupled between a sense node and a first driver node, the circuitry comprising:
  driver circuitry configured to apply a time-varying test stimulus between the first driver node and a second driver node, the test stimulus varied in step changes at a one or more of signal events;
  a reference load coupled between the second driver node and the sense node, the reference load having a programmable impedance comprising:
    a first programmable capacitance; and
    a programmable resistance connected in series with the first programmable capacitance to form a series combination; and
    a second programmable capacitance connected in parallel with the series combination; and
  a first integrator configured to integrate a sense node voltage derived from the sense node to generate a first integrated signal,
  wherein the circuitry is further configured to:
    pre-charge the sense node prior to each of the one or more signal events;
    initialise the first integrator prior to a sequence of the one or more signal events;
    enable the first integrator for a first duration of time following each signal event of the sequence to obtain a measurement of the first integrated signal, the measurement representing a mean value of the sense voltage integrated over the first duration following each signal event of the sequence; and
    adjust the programmable impedance of the reference load based on the measurement.

* * * * *